United States Patent [19]
Huijsing

[11] Patent Number: 4,559,502
[45] Date of Patent: Dec. 17, 1985

[54] MULTI-STAGE AMPLIFIER WITH CAPACITIVE NESTING FOR FREQUENCY COMPENSATION

[75] Inventor: Johan H. Huijsing, Den Hoorn, Netherlands

[73] Assignee: Signetics Corporation, Sunnyvale, Calif.

[21] Appl. No.: 602,234

[22] Filed: Apr. 19, 1984

[51] Int. Cl.$^4$ .............................................. H03F 1/34
[52] U.S. Cl. ..................... 330/294; 330/109; 330/260; 330/310
[58] Field of Search .............. 330/109, 150, 260, 294, 330/307, 310, 107, 311

[56] References Cited

U.S. PATENT DOCUMENTS

| | | | |
|---|---|---|---|
| 4,243,943 | 1/1981 | Cherry | 330/100 |
| 4,335,355 | 6/1982 | Haque | 330/253 |
| 4,366,446 | 12/1982 | Henderson et al. | 330/260 |

OTHER PUBLICATIONS

Grey et al., *Analysis and Design of Analog Integrated Circuits*, (John Wiley and Sons), 1977, pp. 420-426 and 515-521.

Primary Examiner—Eugene R. LaRoche
Assistant Examiner—Steven J. Mottola
Attorney, Agent, or Firm—R. Meetin; R. Mayer; T. Briody

[57] ABSTRACT

A multi-stage amplifier (21, 22, 23, or 24) has three or more amplifier stages (A1, A2, and A3) arranged in a capacitatively nested configuration for frequency compensation. The technique consists of nesting two of the stages together with a pole-splitting capacitor (C1) to form a stable device (21 or 22) and then nesting this device and a third of the stages together with another pole-splitting capacitor (C2) to form the amplifier.

25 Claims, 24 Drawing Figures

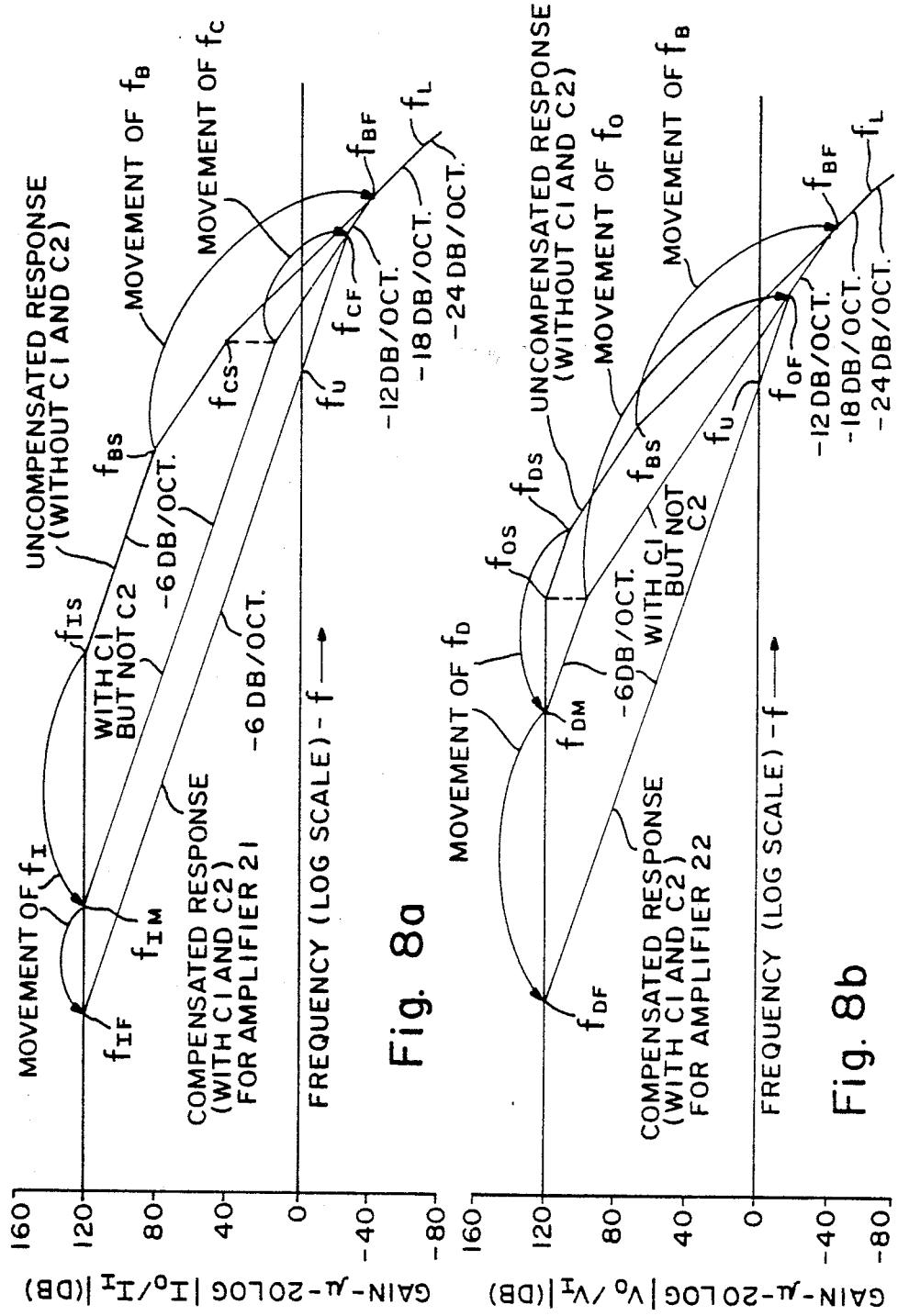

MULTI-STAGE AMPLIFIER WITH CAPACITIVE NESTING FOR FREQUENCY COMPENSATION

FIELD OF USE

This invention relates generally to multi-stage amplifiers having frequency compensation and especially to such amplifiers which are suitable for operational amplifiers made in semiconductor integrated circuit form.

BACKGROUND ART

An operational amplifier (or "op amp") having an inverting (or negative) input terminal, a non-inverting (or positive) input teminal, and an output terminal is typically employed in an amplifier system with a feedback network connected between the output and input terminals. The op amp amplifies an input signal received at the input terminals (or simply "inputs") to produce an output signal at the output terminal (or simply "output"). The gain in the negative feedback loop is $\mu\beta$ where $\mu$ is the forward gain of the op amp and $\beta$ is the gain of the negative feedback network. Depending on the configuration, $\mu$ and $\beta$ may be either voltage gain or current gain.

When the input signal varies at some frequency, the output signal varies similarly. At low frequency, they are substantially in phase. As frequency increases, the phase of the output signal lags progressively behind the phase of the input signal. The loop gain $\mu\beta$ falls off. The system can become unstable. If the phase difference between the signals reaches 180° while $\beta$ is greater than 1, the system oscillates because the feedback is positive.

The minimum acceptable stability margin is considered to occur when the loop phase difference equals 135° at the point where $\mu\beta$ is 1. This roughly translates into the stability rule that the loop gain not fall off more than 9 dB/octave out to the unity-gain frequency.

A feedback network for a system utilizing an op amp is often provided after op amp design is completed. The precise amplitude characteristics of the network thus cannot be taken into account in designing the op amp. The design is typically based on the "worst-case" assumption that the negative feedback gain is one. The resulting stability criterion is that the forward gain $\mu$ of the op amp not roll off more than 9 dB/oct. out to the frequency where $\mu$ is 1.

Perhaps the easiest way to meet this stability criterion is with a single transconductance amplifier stage. FIG. 1 generally shows a conventional differential stage A of this type. FIG. 2 illustrates typical internal details for stage A which centers on emitter-coupled NPN transistors QX and QY. Their bases are connected to its inputs to receive voltages $V_{I-}$ and $V_{I+}$ whose difference is the amplifier input signal $V_I$. Although stage A is basically a transconductance amplifier—i.e., a voltage-to-current converter, the load impedance converts stage A into a voltage amplifier. Its output signal is a voltage $V_O$ supplied at the QX collector.

The frequency response of stage A is largely determined by its single dominant pole dependent on the parasitic capacitance CPO at the output. Referring to FIG. 3, it shows asymptotes for how $\mu$ varies with frequency f for stage A. The gain drops 6 dB/oct. as the frequency $f_O$ of the dominant pole is passed and then 6 dB/oct. more as the higher pole frequency $f_L$ that limits the bandwidth is passed. Bandwidth-limiting frequency $f_L$, which is a characteristic of the overall amplifier system and cannot be altered easily, occurs beyond the unity-gain frequency $f_U$. Stage A thus automatically satisfies the foregoing stability criterion since the gain roll-off is less than 9dB/oct. between $f_O$ and $f_U$. No frequency compensation is needed. However, the maximum gain is typically on the order of 40 dB. This is much too low for many applications.

The gain can be increased by arranging two transconductance amplifier stages in cascade. FIG. 4 generally shows how this is done in a conventional 741 op amp as, for example, described by Gray et al in *Analysis and Design of Analog Integrated Circuits* (John Wiley and Sons), 1977, pages 420–426 and 515–521. In the 741, voltage $V_I$ is differentially supplied to the inputs of a differential stage A' whose output is connected to the inverting input of an inverting stage A". Its output provides voltage $V_O$. A compensating capacitor C is connected between the A" input and output. This connection enables the combination A" and C to act as a current-to-voltage converter. The overall amplifier thereby provides voltage amplification.

Two dominant poles largely determine the frequency response of this two-stage amplifier, one dependent on the parasitic capacitance CPO at the amplifier output and the other dependent on the parasitic capacitance CPA at the A" input. FIG. 5 depicts the asymptotic gain variation for FIG. 4. The upper curve in FIG. 5 represents how the frequency response would appear if capacitor C were absent, while the lower curve represents the actual compensated response. The pole frequencies associated with capacitances CPO and CPA are respectively referred to as $f_O$ and $f_A$. In passing each of frequencies $f_O$, $f_A$, and $f_L$, the gain roll-off increases 6 dB/oct.

In the absence of capacitor C, $f_O$ and $f_A$ would be at respective starting points $f_{OS}$ and $f_{AS}$ where $\mu$ is greater than 1. The combination A' and A" would not meet the foregoing stability criterion since $\mu$ drops 12 dB/oct. after $f_{AS}$ is passed.

Capacitor C provides frequency compensation by splitting the dominant poles further apart. Lower pole $f_O$ moves down to final position $f_{OF}$, while higher pole $f_A$ moves up to final position $f_{AF}$ beyond unity-gain frequency $f_U$. The gain rolls off no more than 6 dB/oct. out to $f_U$ to meet the stability criterion. The maximum gain is typically on the order of 80 dB. Although an improvement, this is still too low for many applications.

In U.S. Pat. No. 4,243, 943, E. Cherry approaches the gain/stability problem with an amplifier typically having three or more stages arranged in a nest of differentiating feedback loops for frequency compensation. The loops are normally centered on the output stage of the amplifier. The basic objective in Cherry is to maximize the return difference around the output stage. The compensation scheme in Cherry involves pole-zero cancellation in which frequency zeros are employed to shift frequency poles to acceptable locations. This is a complex process which severely limits the use of Cherry.

DISCLOSURE OF THE INVENTION

In accordance with the invention, a multi-stage amplifier particularly suitable for use in op amps has three or more amplifier stages arranged in a capacitively nested configuration to achieve frequency compensation. The basic idea is to capacitively nest a pair of stages to form a stable device and then to do the same with this device and another stage. The forward gain of the amplifier normally falls off no more than 9 dB/oct.

out to its unity-gain frequency. This allows the amplifier to meet the foregoing stability rule for loop gain when the circuit is used with a negative feedback network having a gain of unity or less.

The nesting in the amplifier centers on one of the stages here referred to as the first stage. This stage functions (at least) like an inverting amplifier. It has an inverting input and an output. As used herein, "inverting input" means a terminal of an amplifying device whose open-loop output signal is substantially inverse—i.e., reversed in polarity ignoring phase lag—either to a signal at the inverting input of the device or, if it has a "non-inverting input", to a signal at the inverting input relative to a signal at the non-inverting input.

The remaining stages are referred to as the second stage, the third stage, and so on as necessary. Each of them is a transconductance stage that functions (at least) like a non-inverting amplifier. As such, each of the remaining stages has a non-inverting input and an output. As used herein, "non-inverting input" means a terminal of an amplifying device whose open-loop output signal is substantially in phase either with a signal at the non-inverting input of the device or, if it has an "inverting input", to a signal received at the non-inverting input relative to a signal received at the inverting input.

The nesting begins with a composite amplifier section containing the first and second stages. The output of one of the first and second stages is coupled to the input of the other. The remaining input of these two stages is coupled to an inverting input of the composite amplifier section which has an output coupled to the remaining output of the two stages. A first compensating capacitor is coupled between the output and inverting input of the first stage. The value of the first capacitor is selected to make the forward gain of the composite section roll off no more than 9 dB/oct. out to its unity-gain frequency. This meets the foregoing stability criterion to make the composite section suitable for further nesting.

In the next nesting level, the output of one of the composite section and the third stage is coupled to the input of the other of these two components. This creates a three-stage amplifier. It has an inverting input coupled to the remaining input of the composite section and the third stage. The remaining output of these two components is coupled to an output of the three-stage amplifier. A second compensating capacitor is coupled between the output and inverting input of the composite section. The value of the second capacitor is selected to make the forward gain of the three-stage amplifier fall off no more than 9 dB/oct. out to its unity-gain frequency so as to meet the gain roll-off stability criterion.

Numerous variations of the invention are possible. For example, there are four versions of the three-stage amplifier depending on how its stages are intercoupled. The invention may be embodied with various types of transistors such as bipolar transistors, field-effect transistors (FET's), or both. The FET's could be insulated-gate FET's or junction FET's.

Each arrangement of the present amplifier provides high gain in a relatively simple configuration. The compensating capacitors achieve frequency compensation by pole splitting. There is no need to introduce frequency zeros to shift poles. This avoids the difficulty in dealing with pole-zero cancellation as in Cherry. Moreover, there is no particular preference for centering the nesting around the output stage as in Cherry. The present multi-stage amplifier is thus more flexible than Cherry and provides a large improvement over the prior art.

BRIEF DESCRIPTION OF THE DRAWINGS

FIGS. 8a, 8b, 8c, and 8d are logarithmic graphs of qualitative asymptotic frequency response for the respective amplifiers of FIGS. 6a–6d.

Figure 1:
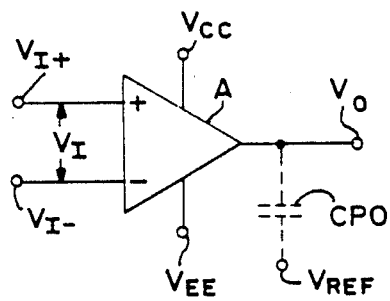
FIGS. 1, 2, and 3 are respectively a block diagram, a circuit diagram, and a logarithmic graph of qualitative asymptotic frequency response for a prior art one-stage amplifier.
Figure 2:
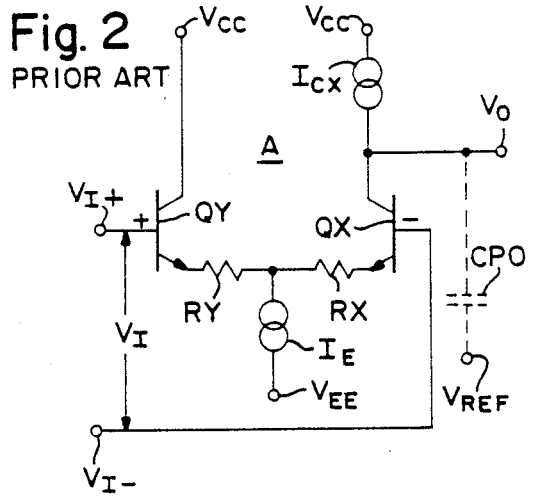
Figure 3:
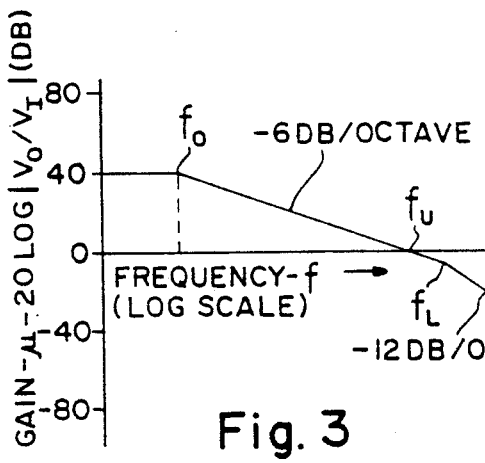
Figure 4:
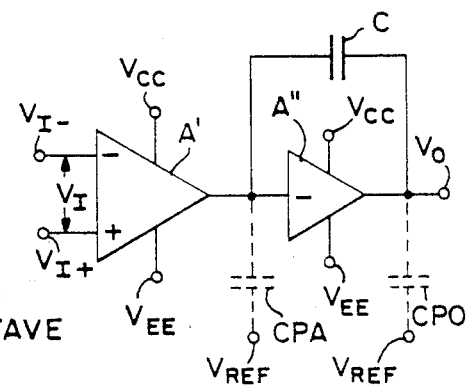
FIGS. 4 and 5 are respectively a circuit diagram and a logarithmic graph of qualitative asymptotic frequency response for a prior art two-stage amplifier.
Figure 5:
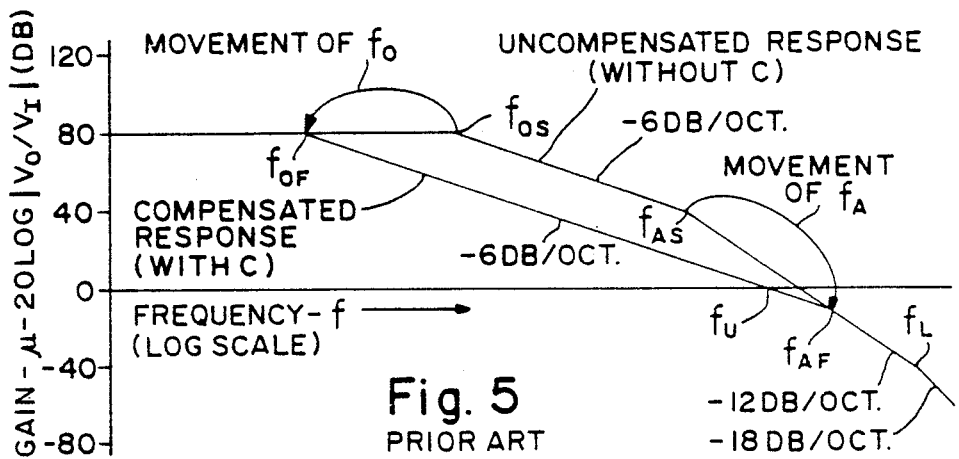

Like reference symbols are employed to identify the same or very similar item or items in the drawings and description of the preferred embodiments. Actual capacitors are indicated in solid lines in the drawings, whereas parasitic capacitances are indicated in dashed lines. Parasitic capacitances are defined relative to a reference voltage $V_{REF}$ which is typically ground. Not shown are parasitic capacitances not relevant to the frequency compensation in this invention.

Certain elements which appear in the drawings but whose operation or reason for employment is generally self-evident are largely not discussed below. In particular, resistors which are identified by the symbol "R" followed by a suitable subscript are generally not discussed. The resistors shown at the emitters of bipolar transistors or the sources of FET's may be actual resistors or intrinsic resistances. Current sources which are identified by the symbol "I" followed by a subscript containing "E", "C", "S", or "D" are generally not discussed. "E" and "C" respectively indicate emitter and collector current sources for bipolar transistors. "S" and "D" respectively indicate source and drain current sources for FET's. Each amplifier is connected between sources of a low supply voltage and a high supply voltage generally indicated respectively as "$V_{EE}$" and "$V_{CC}$" but indicated respectively as "$V_{SS}$" and "$V_{DD}$" for FIG. 14.

DESCRIPTION OF THE PREFERRED EMBODIMENTS

Turning to FIGS. 6a–6d, they respectively illustrate four versions 21, 22, 23, and 24 of a frequency-compensated three-stage amplifier. Each of amplifiers 21-24 operates (at least) as an inverting amplifier having an inverting input for receiving voltage $V_{I-}$ and an output for providing voltage $V_O$. Each of amplifiers 21-24 preferably also has a non-inverting input for receiving voltage $V_{I+}$. Voltages $V_{B1}$, $V_{B2}$, and $V_{B3}$ which are typically, though not necessarily constant, are variously provided to amplifiers 21-24.

The input signal to amplifier 21 or 23 is input current $I_I$ received at its inverting input. Amplifier 21 or 23 amplifies current $I_I$ to produce an output current $I_O$ as its output signal at its output.

The input signal to amplifier 22 or 24 is voltage $V_I$ which consists of voltage $V_{I-}$ taken relative to voltage $V_{I+}$ if there is a non-inverting input. If amplifier 22 or 24 lacks a non-inverting input, voltage $V_I$ is voltage $V_{I-}$ taken relative to some reference voltage. Amplifier 22 or 24 amplifies voltage $V_I$ to produce voltage $V_O$ as its output signal.

Amplifiers 21-24 are all arranged in the same basic way. Two transconductance stages are nested together with a compensating capacitor to form a combination which meets the stability criterion that the gain of the combination not roll off more than 9 dB/oct. out to its unity-gain frequency. This combination and a third transconductance stage are nested together with another compensating capacitor to form a new combination—i.e., amplifier 21, 22, 23, or 24—that satisfies the gain roll-off criterion.

Figure 6A:
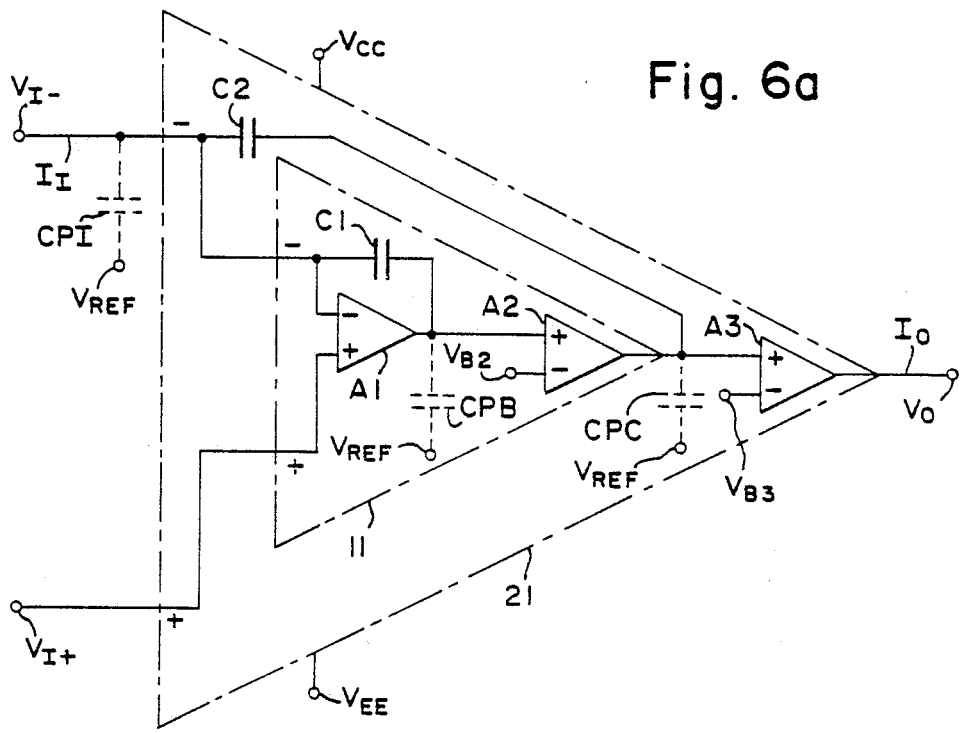
FIGS. 6a, 6b, 6c, and 6d are block diagrams of embodiments of four versions of a three-stage amplifier having capacitive nesting for frequency compensation in accordance with the invention.
Figure 6B:
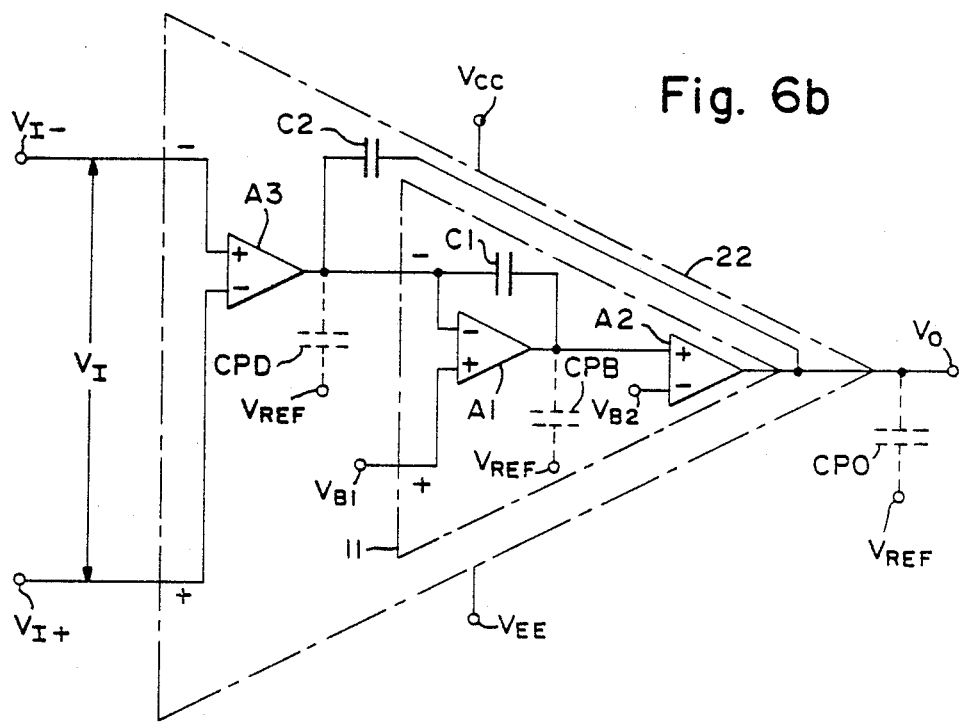

As shown in FIGS. 6a and 6b, amplifiers 21 and 22 each contain a composite amplifier section 11 which amplifies an input signal current to produce an output signal current. Composite section 11 functions (at least) as an inverting amplifier having an inverting input for receiving the input current and an output for providing the output current. If amplifier 21 has a non-inverting input, it is connected to a non-inverting input of section 11. In ampilfier 22, section 11 may have a non-inverting input for receiving voltage $V_{B1}$.

Section 11 contains transconductance amplifier stages A1 and A2, each of which amplifies an input signal to produce an output signal at its output. Stage A1 functions (at least) as an inverting amplifier having an inverting input connected to the inverting input of section 11. If section 11 has a non-inverting input, it is connected to a non-inverting input of stage A1. Stage A2 operates (at least) as a non-inverting amplifier having a non-inverting input connected to the output of stage A1 to receive its output signal. Stage A2 may have an inverting input for receiving voltage $V_{B2}$. The A2 output is connected to the output of section 11. A compensating capacitor C1 is connected between the output and inverting input of stage A1 to provide frequency compensation for amplifier 11. This connection makes the combination A1 and C1 into a current-to-voltage converter across the frequency range in which capacitor C1 dominates the transfer function. Since stage A2 is a transconductance device—i.e., a voltage-to-current converter, section 11 is a current amplifier.

In addition to section 11, amplifier 21 or 22 contains a compensating capacitor C2 and a transconductance amplifier stage A3 which amplifies an input signal to provide an output signal at its output. Stage A3 operates (at least) as a non-inverting amplifier having a non-inverting input. Capacitor C2 is connected between the output and inverting input of section 11 to provide frequency compensation for amplifier 21 or 22.

In amplifier 21, the inverting input of section 11 is connected to the inverting input of amplifier 21 to receive signal current $I_I$. The non-inverting A3 input is connected to the output of section 11 to receive its output signal. The A3 output is connected to the output of amplifier 21 to provide signal current $I_O$. Stage A3 in amplifier 21 may have an inverting input for receiving voltage $V_{B3}$. The connection of capacitor C2 across section 11 causes the combination 11 and C2 to operate as a current-to-voltage converter over the frequency range in which capacitor C2 dominates the transfer function. Since stage A3 is a voltage-to-current converter, amplifier 21 is a current amplifier.

In amplifier 22, the output of section 11 is connected to the output of amplifier 22 to provide signal voltage $V_O$. The inverting input of section 11 is connected to the output of stage A3 to receive its output signal. The non-inverting A3 input is connected to the inverting input of amplifier 22 to receive voltage $V_{I-}$. Stage A3 in amplifier 22 preferably has an inverting input connected to the non-inverting input of amplifier 22 to receive voltage $V_{I+}$. Since stage A3 is a voltage-to-current converter and section 11 is a current-to-voltage converter, amplifer 22 acts as a voltage amplifier.

Figure 6C:
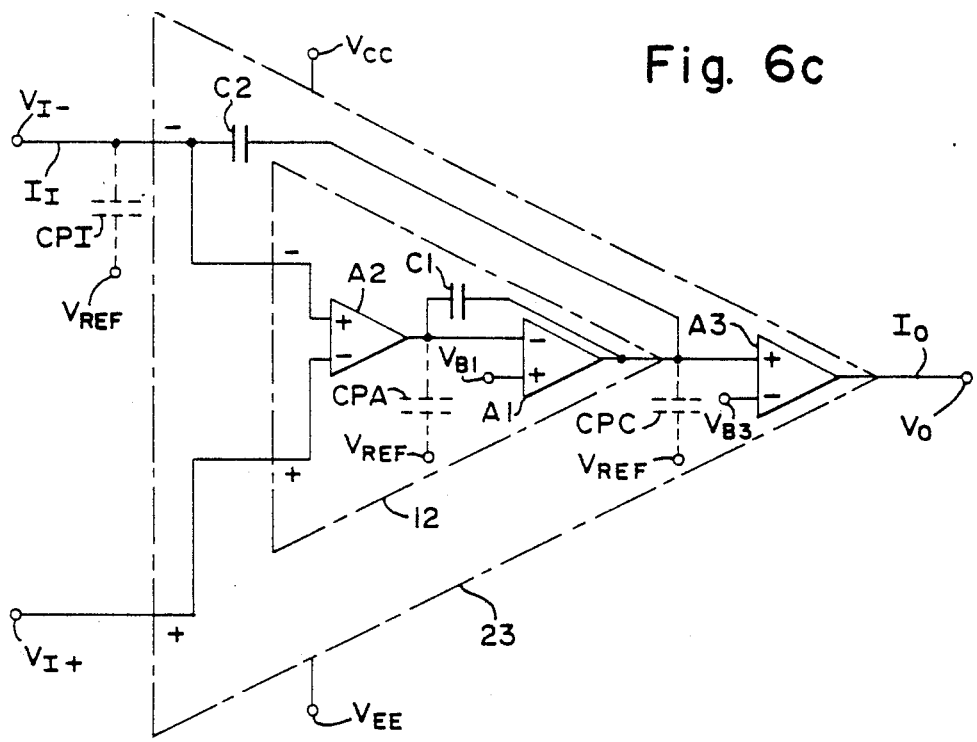
Figure 6D:
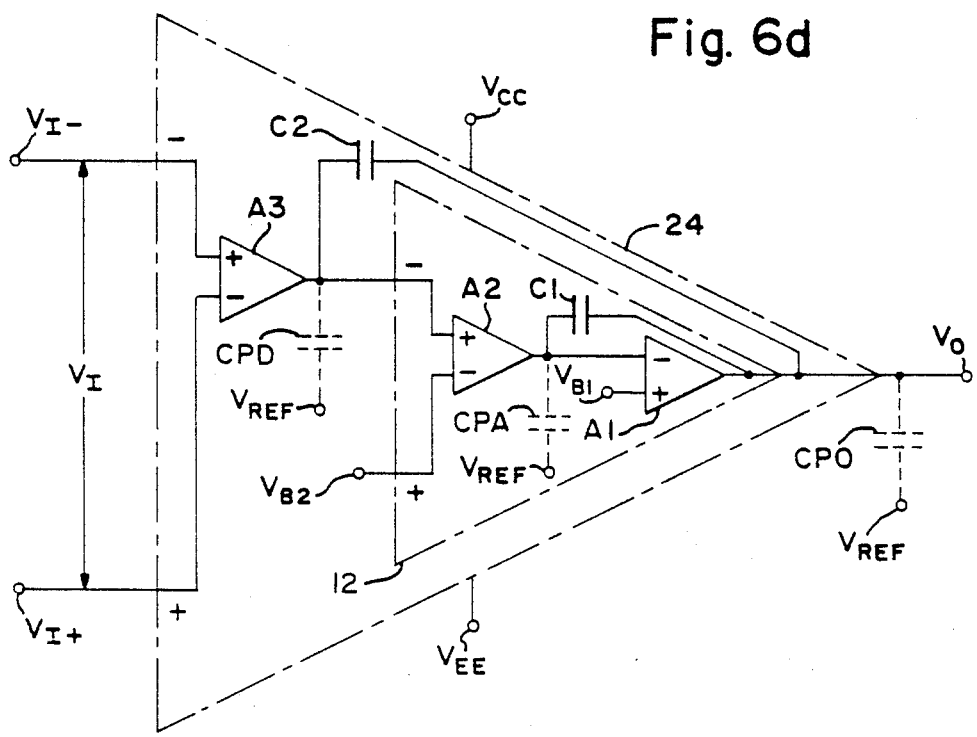

As depicted in FIGS. 6c and 6d, amplifiers 23 and 24 each contain transconductance stages A1 and A2 and compensating capacitor C1 interconnected to form a frequency-compensated composite amplifier section 12 which amplifies an input signal voltage to produce an output signal voltage. Composite section 12 functions (at least) as an inverting amplifier having an inverting input and an output. If amplifier 23 has a non-inverting input, it is connected to a non-inverting input of section 12. In amplifier 24, section 12 may have a non-inverting input which receives voltage $V_{B2}$.

The inverting input of section 12 is connected to the non-inverting input of stage A2 whose output is connected to the inverting input of stage A1. Its output is connected to the output of amplifier 12. Stage A1 may have a non-inverting input for receiving voltage $V_{B1}$. Capacitor C1 is connected between the output and inverting input of stage A1 to frequency compensate amplifier 12. Since the combination A1 and C1 is thereby a current-to-voltage converter, section 12 is a voltage amplifier.

As in amplifiers 21 and 22, the remaining elements in amplifiers 23 and 24 are capacitor C2 and transconductance stage A3. Capacitor C2 is connected between the output and inverting input of section 12 to provide frequency compensation for amplifier 23 or 24. This connection causes the combination 12 and C2 to operate as a current-to-voltage converter across the frequency range in which capacitor C2 dominates the transfer function. Stage A3 is interconnected with section 12 in amplifiers 23 and 24 the same as stage A3 is respectively interconnected with section 11 in amplifiers 21 and 22. Amplifier 23 thus acts as a current amplifier, while amplifier 24 acts as a voltage amplifier.

FIGS. 7a-7d show respective bipolar embodiments of amplifiers 21-24. The main part of stage A1 is an NPN transistor QX1. Its base and collector are respectively connected to the inverting input and output of stage A1. Transistor QX1 is emitter coupled to an NPN transistor QY1 whose base is connected to the non-inverting A1 input. Transistors QX1 and QY1 operate as a conventional differential amplifier in combination with elements RX1, RY1, $I_{E1}$, and $I_{CX1}$. Stage A2 centers on emitter-coupled NPN transistors QX2 and QY2.

Their bases are respectively connected to the inverting and non-inverting inputs of stage A2 whose output comes from the QX2 collector. Transistors QX2 and QY2 operate as a conventional differential amplifier in conjunction with elements RX2, RY2, $I_{E2}$, and $I_{CX2}$. Similarly, stage A3 centers on emitter-coupled NPN transistors QX3 and QY3. Their bases are respectively connected to the inverting and non-inverting inputs of stage A3 whose output comes from the QX3 collector. Transistors QX3 and QY3 operate as a conventional differential amplifier in conjunction with elements RX3, RY3, $I_{E3}$, and $I_{CX3}$.

Three dominant poles largely determine the frequency response of each of amplifiers 21–24. The asymptotic gains as a function of frequency for amplifiers 21–24 are respectively illustrated in FIGS. 8a–8d. The upper curves in FIGS. 8a–8d respectively represent how the gain $\mu$ for the corresponding one of amplifiers 21–24 would asymptotically vary if neither capacitor C1 nor C2 were present. The middle curves indicate how $\mu$ would vary if capacitor C1 were present but not capacitor C2. The lower curves show the actual compensated asymptotic gain variations.

The following convention is used in FIGS. 8a–8d and the accompanying analysis of pole splitting. The pole frequencies associated with parasitic capacitances CPI, CPO, CPA, CPB, CPC, and CPD are respectively indicated as $f_I$, $f_O$, $f_A$, $f_B$, $f_C$, and $f_D$. They would be at respective starting frequencies $f_{IS}$, $f_{OS}$, $f_{AS}$, $g_{BS}$, $f_{CS}$, and $f_{DS}$ if capacitors C1 and C2 were absent and are at respective final frequencies $f_{IF}$, $f_{OF}$, $f_{AF}$, $f_{BF}$, $f_{CF}$, and $f_{DF}$. As appropriate, poles $f_I$, $f_D$, $f_A$ and $f_O$ would be at intermediate frequencies $f_{IM}$, $f_{DM}$, $f_{AM}$, and $f_{OM}$ with capacitor C1 inserted to compensate composite section 11 or 12 but with capacitor C2 absent.

Input and output capacitances CPI and CPO are (normally) greater than internal capacitances CPA–CPD. Accordingly, each starting frequency $f_{IS}$ or $f_{OS}$ is (presumed to be) less than each of starting frequencies $f_{AS}$–$f_{DS}$.

In the equations below, $C_1$ and $C_2$ are the respective values of capacitors C1 and C2. $C_{PI}$, $C_{PO}$, $C_{PA}$, $C_{PB}$, $C_{PC}$, and $C_{PD}$ are the respective values of capacitances CPI, CPO, and CPA–CPD. $G_{M1}$, $G_{M2}$, and $G_{M3}$ are the respective transconductances of stages A1–A3.

The unity-gain frequency $f_U$ for each of amplifiers 21–24 is approximately:

$$f_U = G_{M3}/2\pi C_2$$

This unity-gain frequency applies to all the lower curves in FIGS. 8a–8d.

The overall amplification system for each of amplifiers 21–24 is characterized by bandwidth-limiting frequency $f_L$ which occurs beyond $f_U$. The gain drops 6 dB/oct. in passing the first dominant pole and then 6 dB/oct. more as each further pole including $f_L$ is passed. The final frequencies to which the dominant poles are moved for amplifiers 21–24 normally cannot exceed $f_L$. If any final pole frequency calculated from the below equations exceeds $f_L$, that final frequency is assumed to equal $f_L$.

The dominant poles for amplifier 21 depend on the parasitic capacitances CPI at the amplifier input, CPB at the A1 output, and CPC at the output of section 11. For the purpose of illustration, $f_{BS}$ is presumed to be less than $f_{CS}$. The reverse could equally be well true. As indicated in FIGS. 8a, $f_{IS}$, $f_{BS}$, and $f_{CS}$ all occur where $\mu$ exceeds 1. If capacitors C1 and C2 were both absent, $\mu$ would fall more than 9 dB/oct. after passing $f_{BS}$ but before reaching 1. The combination A1–A3 without capacitors C1 and C2 would not meet the gain roll-off stability criterion.

Insertion of capacitor C1 splits poles $f_I$ and $f_B$ further apart to enable section 11 of amplifier 21 to satisfy the stability criterion. Lowest pole $f_I$ moves down to $f_{IM}$. Higher pole $f_B$ moves up to $f_{BF}$ beyond the point at which $f_U$ occurs in fully compensated amplifier 21. Section 11 would then be stable if used with negative feedback connecting the output of section 11 directly to its inverting input.

With capacitor C1 present, insertion of capacitor C2 similarly splits poles $f_I$ and $f_C$ further apart in amplifier 21. Lowest pole $f_I$ moves further down to $f_{IF}$. Highest pole $f_C$ moves up beyond $f_U$ to $f_{CF}$. The gain does not fall off more than 9 dB/oct. before reaching $f_U$. Subject to the condition that $f_U < f_{CF} \leq f_{BF}$, amplifier 21 satisfies the gain roll-off stability criterion and would be unconditionally stable when used with negative feedback having a gain of 1 (or less).

The $C_1$ and $C_2$ values needed to achieve the foregoing compensation in amplifier 21 can be approximately calculated from the following equations:

$$f_{BF} = G_{M1}/2\pi C_{PI}(1 + C_{PB}/C_1)$$

$$f_{CF} = G_{M2}/2\pi C_1(1 + C_{PC}/C_2)$$

The foregoing equations hold whether $f_{BS}$ is less than $F_{CS}$ or not.

The situation is similar but somewhat more complex for amplifier 22. Its dominant poles depend on the parasitic capacitances CPO at the amplifier output, CPB at the A1 output, and CPD at the input of section 11. For the purpose of illustration, $f_{DS}$ is presumed to be less than $f_{BS}$, although the opposite could as well be true. Without capacitors C1 and C2, the combination A1–A3 would again not meet the stability criterion as shown in FIG. 8b.

Insertion of capacitor C1 splits poles $f_D$ and $f_B$ to enable section 11 of amplifier 22 to meet the stability criterion. Pole $f_D$ moves down to $f_{DM}$ lower than $f_O$—i.e., $f_D$ crosses $f_O$. The lowest pole is now $f_D$. Highest pole $f_B$ moves up to $f_{BF}$ beyond the frequency for $f_U$ in fully compensated amplifier 22. Insertion of capacitor C2 similarly splits poles $f_D$ and $f_O$. Lowest pole $f_D$ moves further down to $f_{DF}$. Higher pole $f_O$ moves up beyond $f_U$ to $f_{OF}$. Amplifier 22 meets the stability criterion subject to the condition that $f_U < f_{OF} \leq f_{BF}$.

The $C_1$ and $C_2$ values for amplifier 22 can be approximately calculated from the following equations:

$$f_{BF} = G_{M1}/2\pi C_{PD}(1 + C_{PB}/C_1 + C_{PB}/C_{PD})$$

$$f_{OF} = G_{M2}/2\pi C_1(1 + C_{PO}/C_2)$$

If $f_{BS}$ were less than $f_{DS}$, one of poles $f_B$ and $f_D$ would move down to the position shown for $f_{DF}$ while the other would move up to the position indicated for $f_{BF}$. The first of the two preceding equations still gives the value for the highest pole.

Figure 8C:
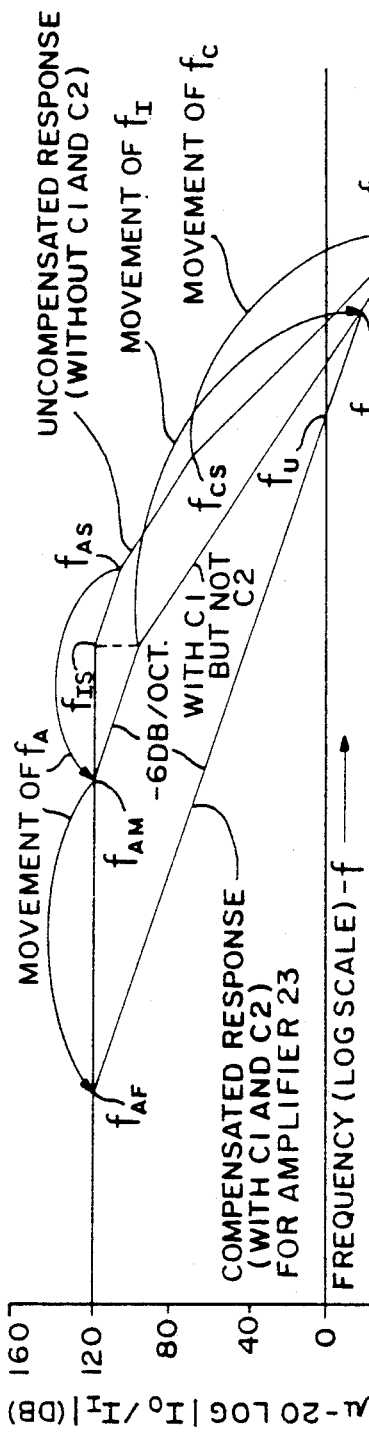
Figure 8D:
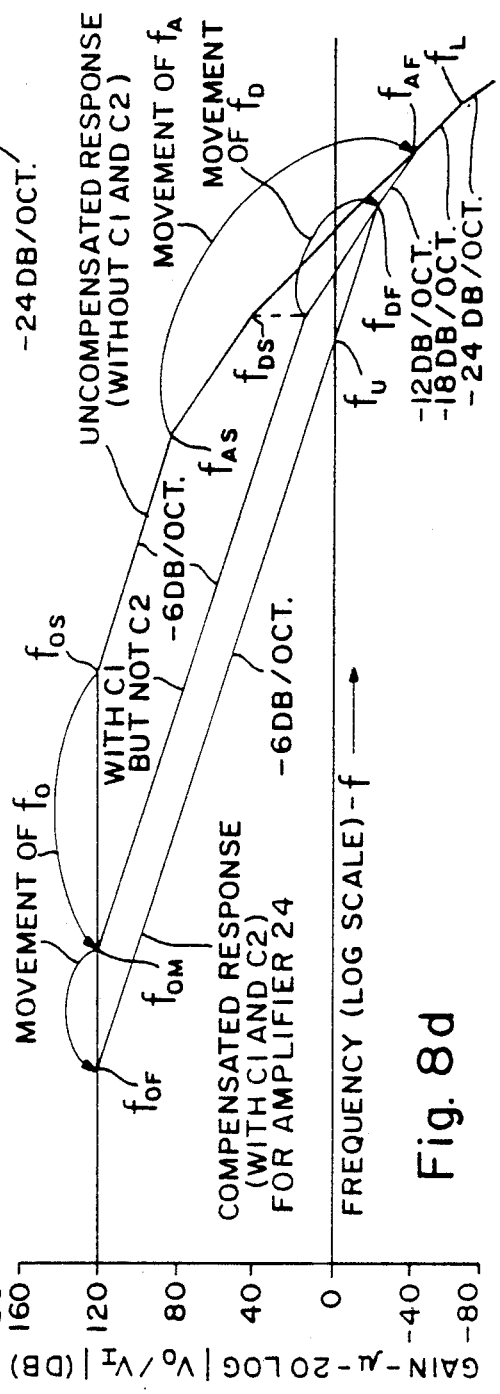

The situations for amplifiers 23 and 24 are largely self-explanatory using the symbol convention given above for FIGS. 8a–8d. Amplifier 23 has dominant poles dependent on the parasitic capacitances CPI at the amplifier input, CPA at the A1 input, and CPC at the output of composite section 12. Amplifier 24 has dominant poles dependent on the parasitic capacitances CPO at the amplifier output, CPA at the A1 input, and CPD at the input of section 12. Without capacitors C1 and C2, the combination A1–A3 would not meet the gain roll-off stability criterion as indicated in FIGS. 8c and 8d. The compensation in amplifier 23 and its section 12 is basically the same as the compensation in amplifier 22 and its section 11. The compensation in amplifier 24 and its section 12 is basically the same as the compensation in amplifier 21 and its section 11.

The stability condition for amplifier 23 is that $f_U < f_{IF} \leq f_{CF}$ presuming, for example, that $f_{AS}$ is less than $f_{CS}$. The following equations give approximate $C_1$ and $C_2$ values for amplifier 23:

$$f_{CF} = G_{M1}/2\pi C_{PC}(1 + C_{PA}/C_1 + C_{PA}/C_{PC})$$

$$f_{IF} = G_{M2}/2\pi C_1(1 + C_{PI}/C_2)$$

If $f_{CS}$ were less than $f_{AS}$, one of poles $f_A$ and $f_C$ would move down to the indicated position for $f_{AF}$ while the other would move up to the position shown for $f_{CF}$. The first of the two preceding equations still gives the value for the highest pole.

The stability condition for amplifier 24 is that $f_U < f_{DF} \leq f_{AF}$. The following equations likewise give approximate $C_1$ and $C_2$ values for amplifier 24:

$$f_{AF} = G_{M1}/2\pi C_{PO}(1 + C_{PA}/C_1)$$

$$f_{DF} = G_{M2}/2\pi C_1(1 + C_{PD}/C_2)$$

These equations are valid if $f_{AS}$ is less than $f_{DS}$ or vice versa.

The dominant pole frequencies for the types of amplifiers shown in FIGS. 7a–7d are not materially affected if voltage followers are placed at the stage inputs. Likewise, the dominant poles for these types of amplifiers do not significantly change if current followers are at the stage outputs.

Figure 7A:
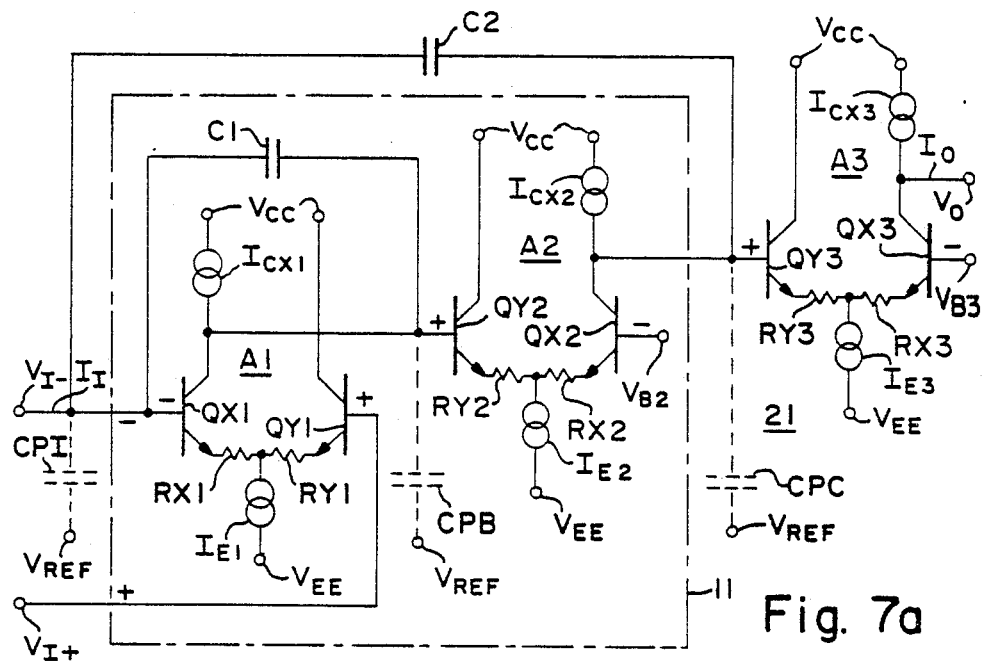
FIGS. 7a, 7b, 7c, and 7d are circuit diagrams of bipolar embodiments of the respective amplifiers of FIGS. 6a–6d.
Figure 7B:
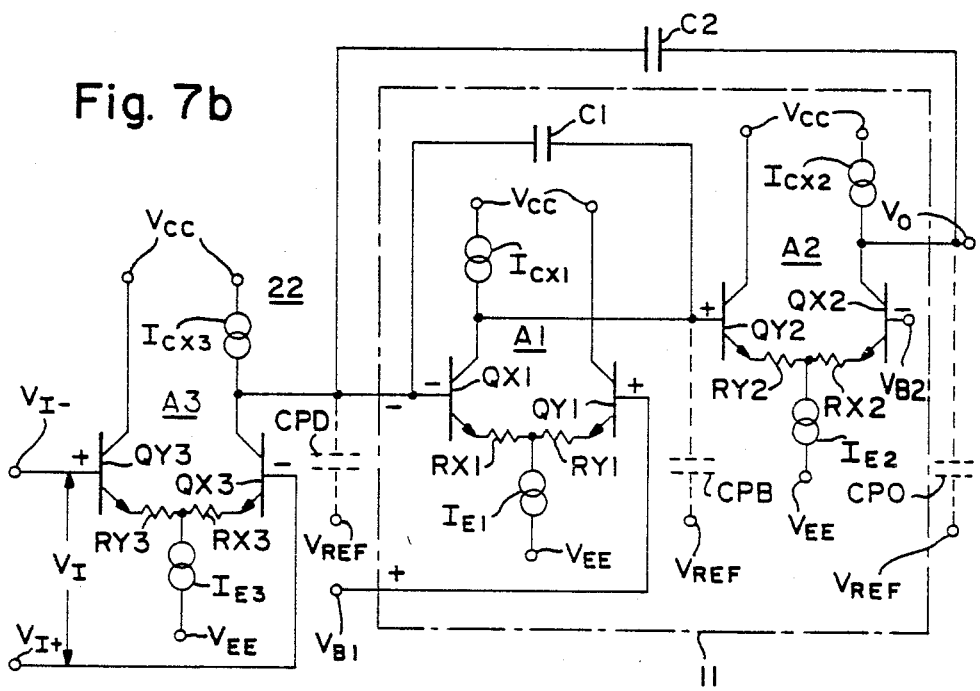
Figure 7C:
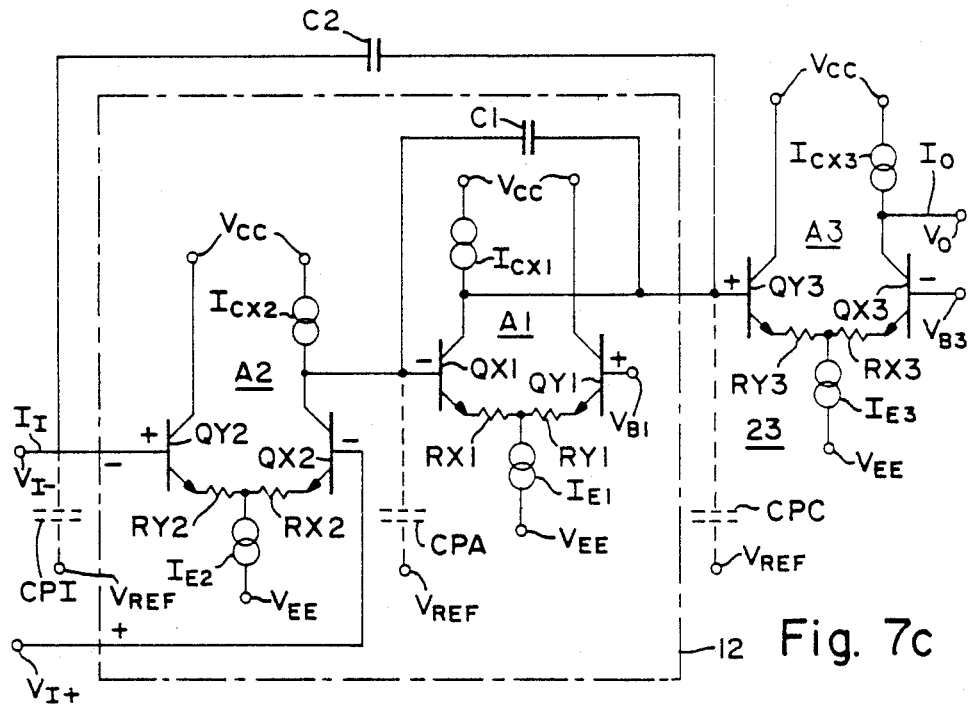
Figure 9:
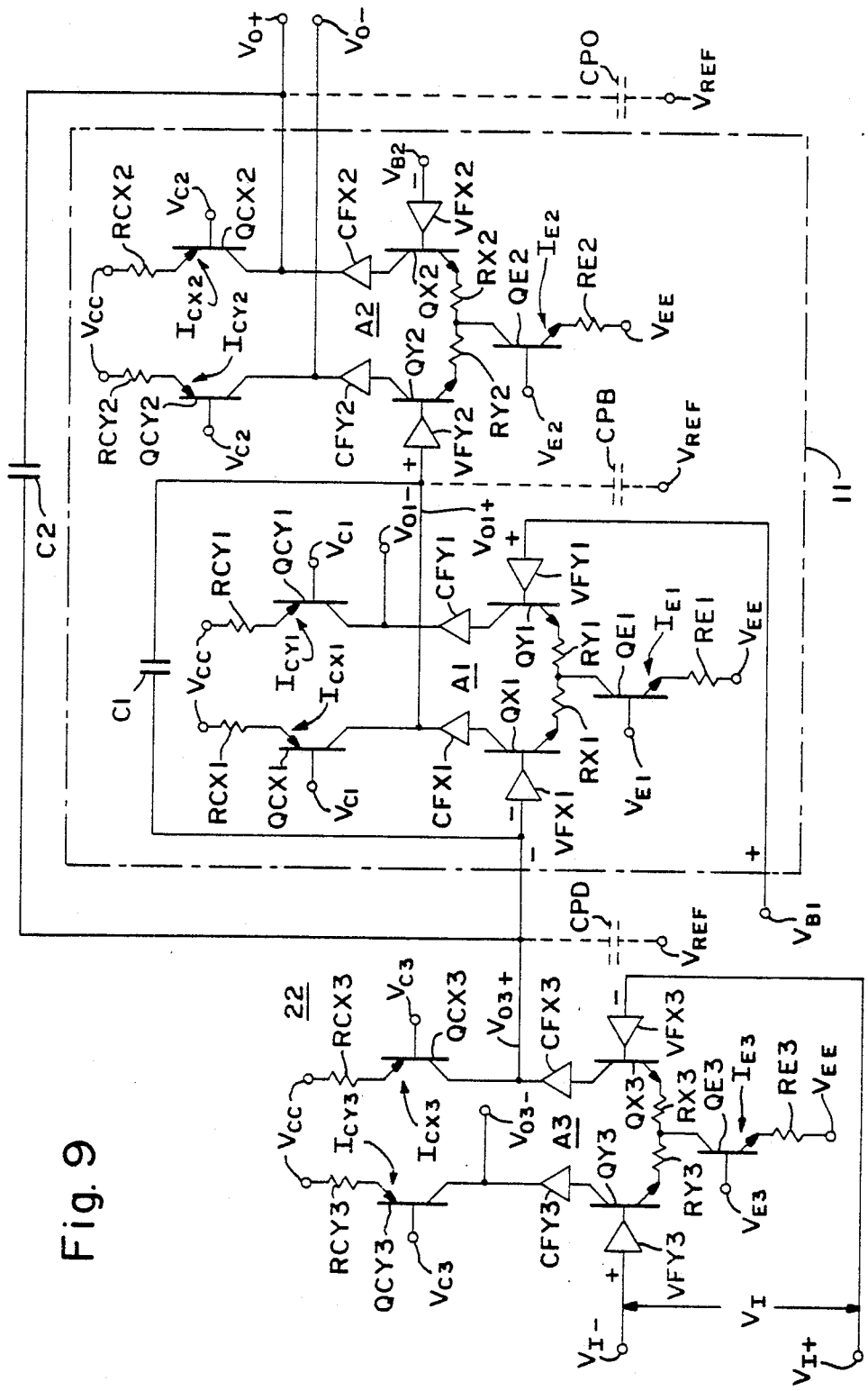
FIGS. 9, 10a, and 10b are respective circuit diagrams for a more generalized embodiment of the amplifier of FIG. 7b, a typical current follower used in this embodiment, and a typical voltage follower used in this embodiment.

FIG. 9 shows a basic embodiment of amplifier 22 of FIG. 7b in which voltage and current followers are at the stage inputs and outputs. Each voltage follower is indicated by a symbol consisting of "VF" followed by the last two letters of the symbol for the transistor whose base is connected to that voltage follower. Each current follower is similarly indicated by a symbol consisting of "CF" followed by the last two letters of the symbol for the transistor whose collector is connected to that current follower. In addition to its regular or "non-inverting" output, each of stages A1–A3 may also have an "inverting" output which provides a signal inverse to the output signal at the non-inverting output. This situation is shown in FIG. 9 where the signals from the non-inverting and inverting outputs are respectively differentiated by "+" and "−" signs. As illustrated in FIG. 9, collector current sources must also be provided for any of transistors QY1–QY3 from which an inverting output signal is made available. Finally, FIG. 9 illustrates typical configurations for the emitter and collector current sources.

Figure 10A:
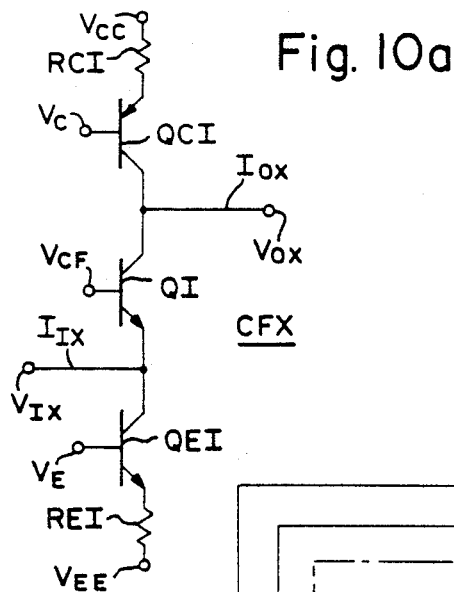
Figure 10B:
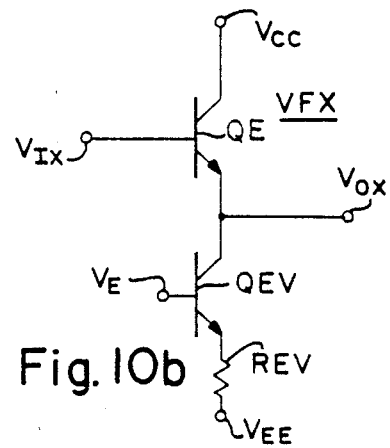

FIGS. 10a and 10b, which are largely self-explanatory, respectively depict typical current and voltage followers CFX and VFX suitable for the present bipolar amplifiers such as that of FIG. 9. Current follower CFX has input and output terminals which carry currents $I_{IX}$ and $I_{OX}$ and which are connected to the amplifier by way of the collector of the associated "QX" transistor and its collector current source. Voltage follower VFX has input and output terminals which are at voltages $V_{IX}$ and $V_{OX}$ and which are connected to the amplifier by way of the stage input and the base of the associated "QX" transistor.

In the present amplifiers, the "leading" stage of a chain of amplifier stages is the stage that receives the input signal to the chain. The stage that supplies the output signal of the chain is its "trailing" stage. Each stage between the leading and trailing stages is an intermediate or "middle" stage.

If the leading stage in any of amplifiers 21–24 has an inverting output and if the middle stage has both inverting and non-inverting inputs, the inverting output may be connected to the input of the middle stage not connected to the non-inverting output of the leading stage. The same thing may be done with the middle and trailing stages. This improves the balancing to increase the common-mode rejection ratio.

Figure 7D:
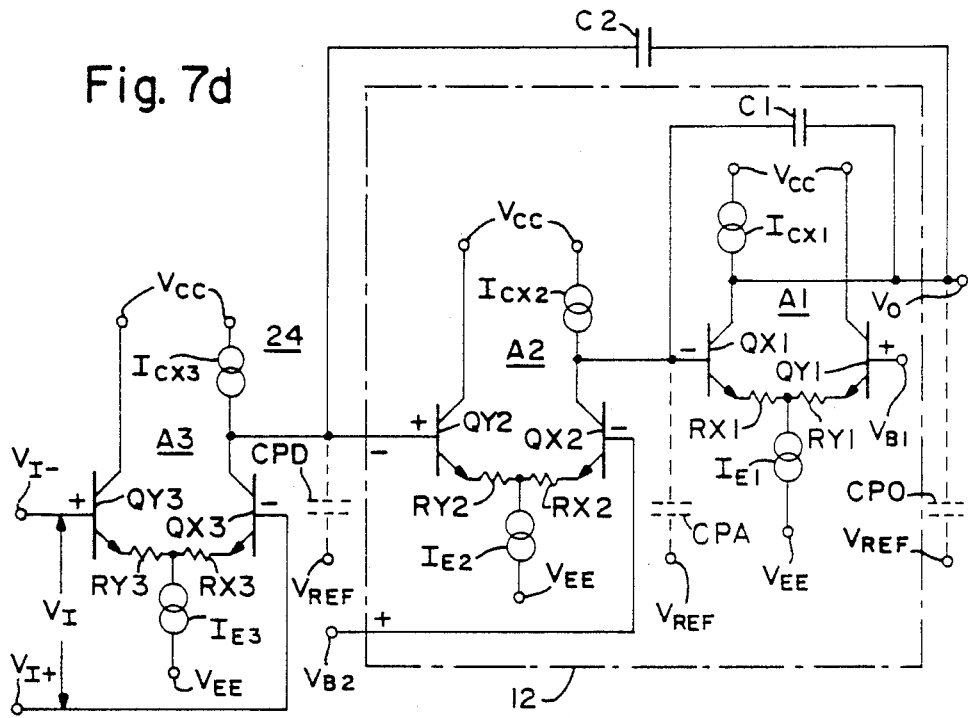
Figure 11:
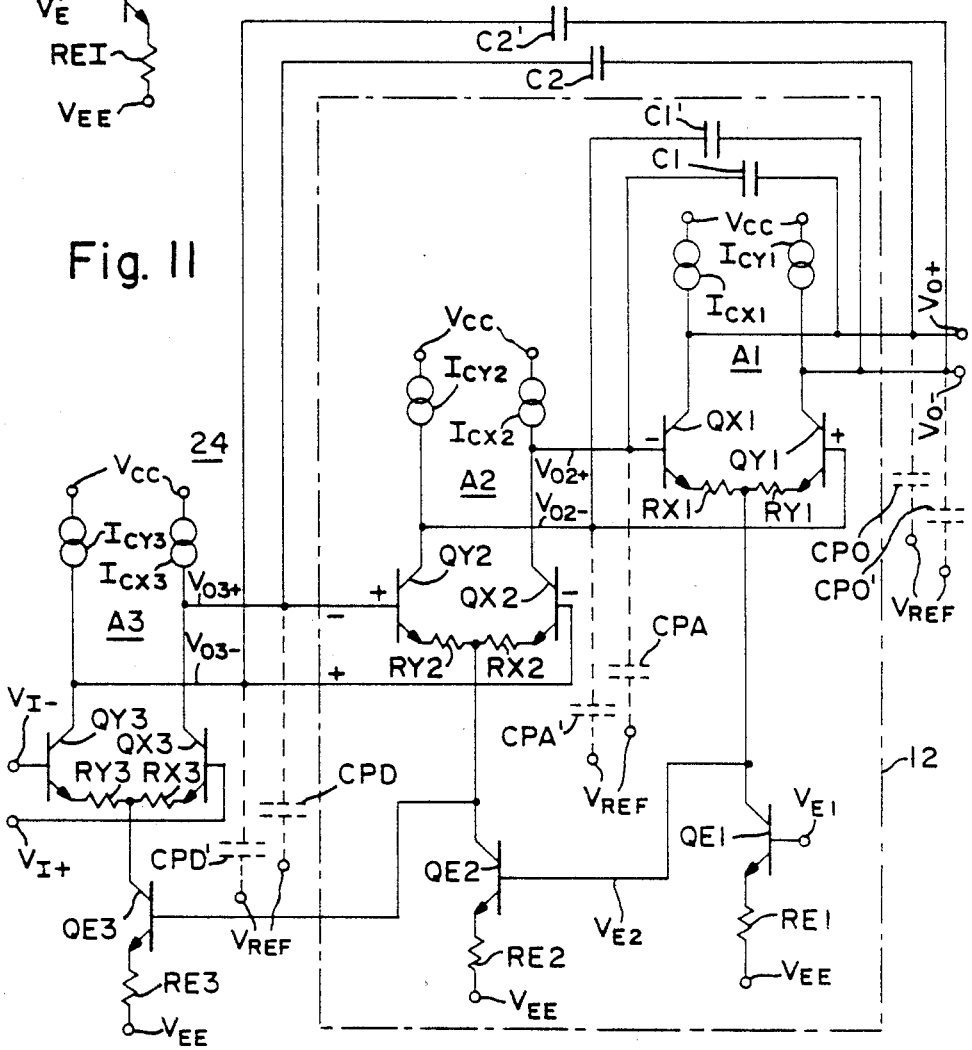
FIG. 11 is a circuit diagram of a more particular embodiment of the amplifier of FIG. 7d containing further inter-stage coupling.

FIG. 11 shows an embodiment of FIG. 7d in which the leading and middle stages are further connected to the middle and trailing stages in this way. In particular, the collector of transistor QY3 in leading stage A3 is connected to the base of transistor QX2 in middle stage A2. The collector of transistor QY2 in middle stage A2 is connected to the base of transistor QY1 in trailing stage A1.

These connections introduce three other symmetrical poles, one dependent on the parasitic capacitance CPO' at the amplifier inverting output, another dependent on the parasitic capacitance CPA' at the non-inverting A1 input, and the third dependent on the parasitic capacitance CPD' at the non-inverting input to section 12 of amplifier 24. Accordingly, a further capacitor C1' is connected between the non-inverting input and inverting output of stage A1 to frequency compensate section 12 in the manner described above for capacitor C1. Likewise, a further capacitor C2' is connected between the non-inverting input and inverting output of section 12 to frequency compensate amplifier 24 in the way described above for capacitor C2. Additionally, the emitter current sources normally must operate at specified voltages which can be achieved by interconnecting the current sources as indicated in FIG. 11. The foregoing considerations also apply to the other amplifiers of the invention.

Figure 12:
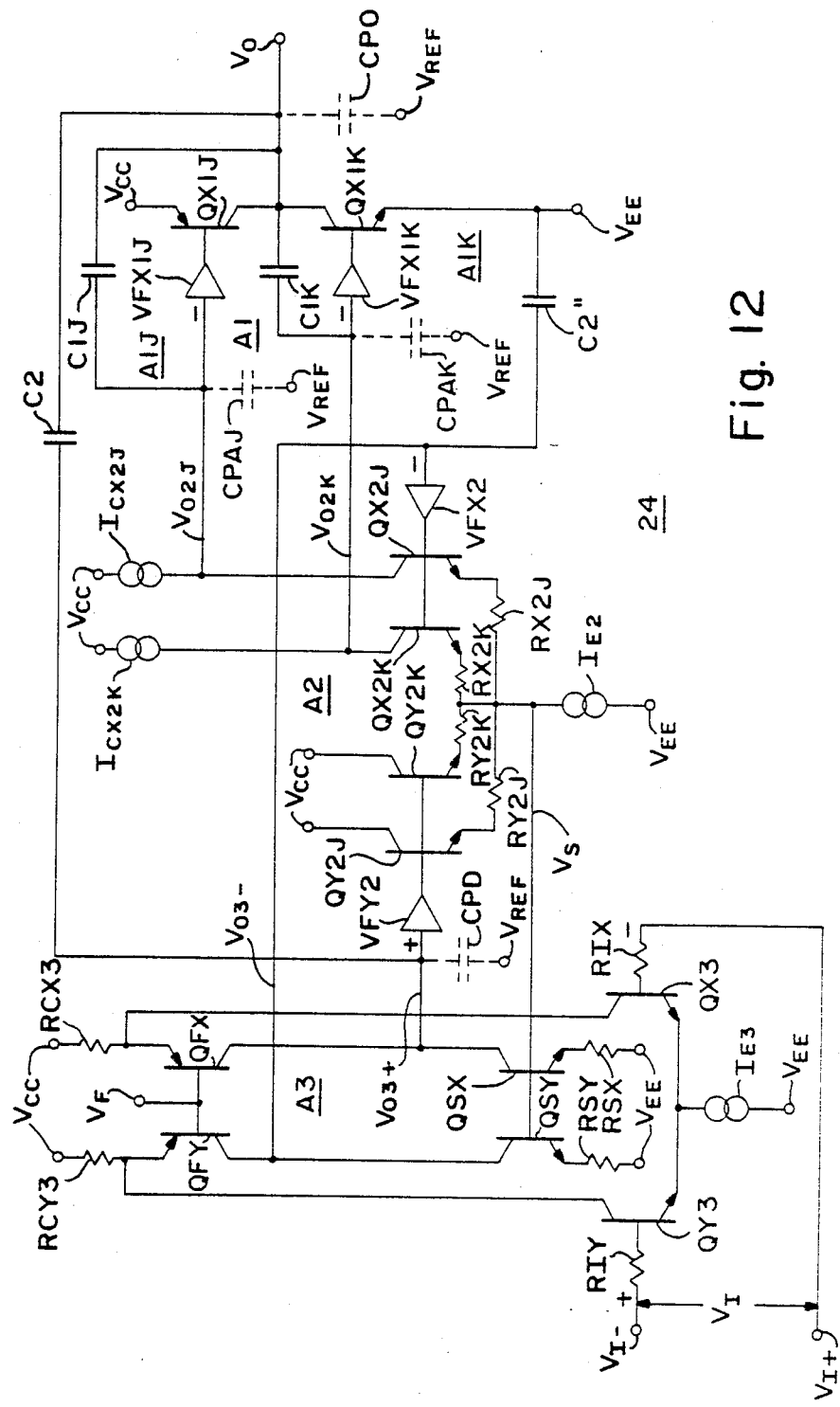
FIG. 12 is a circuit diagram of a preferred bipolar emobidment of the amplifier of FIG. 6d.

FIG. 12 illustrates a preferred bipolar embodiment of amplifier 24. Stage A3 here provides non-inverting and inverting output signals $V_{O3+}$ and $V_{O3-}$ from folded current followers connected to the QX3 and QY3 collectors. These current followers consist of PNP transistors QFX and QFY which are collector coupled to current-source NPN transistors QSX and QSY. Signals $V_{O3-}$ and $V_{O3+}$ are supplied to stage A2 at its inverting and non-inverting inputs which are coupled through voltage followers VFX2 and VFY2 (where stage A2 divides into a pair of substages) to its amplifying transistor pair QX2J and QY2J and its amplifying transistor pair QX2K and QY2K. Stage A2 provides a pair of non-inverting output signals $V_{O2J}$ and $V_{O2K}$ from the QX2J and QX2K collectors.

Stage A1 here consists of a pair of parallel substages A1J and A1K, each having an inverting input. In substage A1J, its inverting input receives signal $V_{O2J}$ and is coupled through a voltage follower VFX1J to a PNP transistor QX1J. In substage A1K, its inverting input receives signal $V_{O2K}$ and is coupled through a voltage follower VFX1K to an NPN transistor QX1K. The QX1J and QX1K collectors, which provide the A1J and A1K output signals, are connected together to generate voltage $V_O$.

Aside from the dominant poles which depend on capacitances CPO and CPD and which are split by capacitor C2, amplifier 24 in FIG. 12 has a pair of dominant poles dependent on the parasitic capacitances CPAJ and CPAK at the inverting A1J and A1K inputs. Capacitors C1J and C1K are connected between the amplifier output and the respective A1J and A1K inputs to split the pole associated with capacitance CPO from the poles associated with capacitances CPAJ and CPAK. This provides frequency compensation for stages A1 and A2 in the manner described above. A capacitor C2" is connected between the $V_{EE}$ supply and the A2 inverting input to make it a virtual ground at high frequency.

In FIG. 12, supply voltages $V_{EE}$ and $V_{CC}$ respectively are greater than 0.9 volt and less than −0.9 volt. Resistors R1X/R1Y, RCX3/RCY3, RSX/RSY, RX2J/RY2J, and RX2K/RY2K respectively are 3,000, 50,000, 50,000, 5,000 and 5,000 ohms. Current sources $I_{E3}$, $I_{E2}$, and $I_{CX2J}/I_{CX2K}$ respectively are 2, 20, and 5 microamperes. Capacitors C1J and C1K are each 3 picofarads. Capacitors C2 and C2" are each 10 picofarads. Capacitances CPO, CPAJ/CPAK, and CPD are respectively about 200, 3, and 3 picofarads. Gain $\mu$ is about 110 dB at low frequency, while $f_U$ is about 1 megahertz.

The frequency-compensation techniques used in amplifiers 21-24 may be extended to amplifiers having more than three stages to achieve higher gain. Each further stage adds another dominant pole which is suitably moved according to the present capacitive technique to provide frequency compensation.

Figure 13:
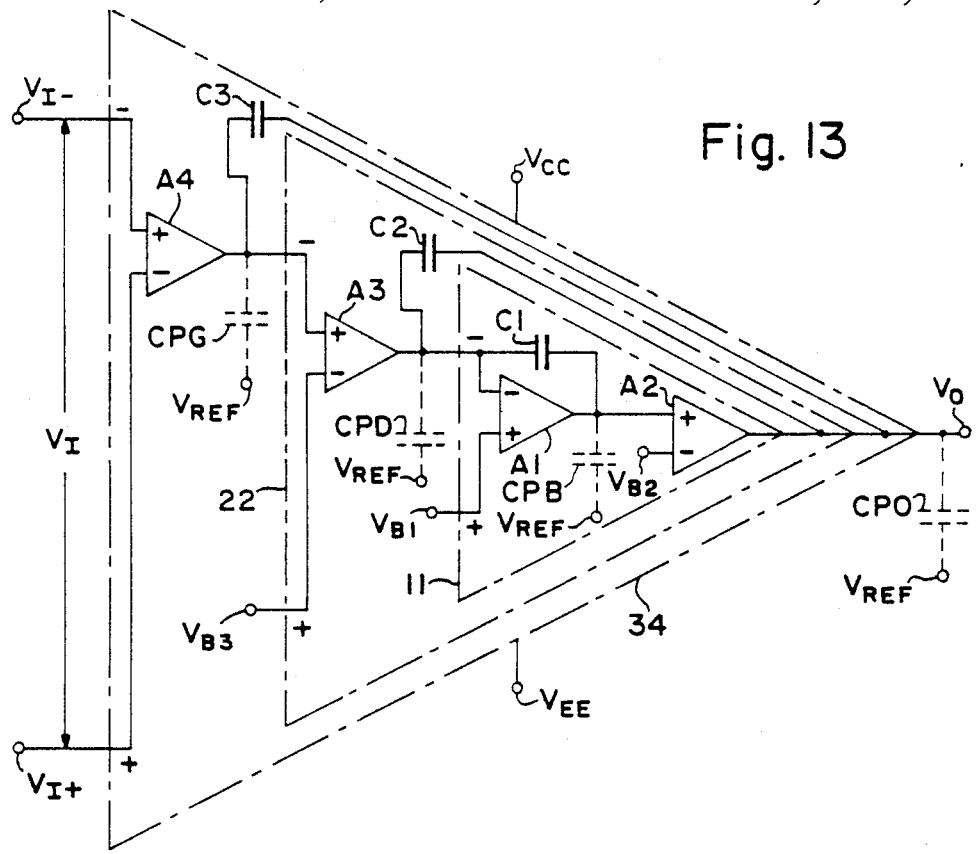
FIG. 13 is a circuit diagram of an embodiment of a four-stage amplifier having capacitive nesting for frequency compensation in accordance with the invention.

FIG. 13 illustrates a four-stage amplifier 34 consisting of three-stage amplifier 22, a transconductance amplifier stage A4, and a compensating capacitor C3. Stage A4 operates the same as stage A3 and is connected to internal amplifier 22 in the same way as stage A2 is connected to section 11. Likewise, capacitor C3 is connected between the inverting input and the output of internal amplifier 22 to provide frequency compensation for the dominant pole dependent on the parasitic capacitance CPG at the inverting input of amplifier 22 in the same manner as capacitor C2 frequency compensates amplifier 22.

The present amplifiers may be partly or wholly embodied in technology other than bipolar. FET's of both the insulated-gate and junction types may be used. Each transistor then has a first flow electrode, a second flow electrode, and a control electrode which regulates current transmission between the flow electrodes. For a bipolar transistor, its base, emitter, and collector respectively are the first, second, and control electrodes. These electrodes are respectively the gate, source, and drain for an FET.

Figure 14:
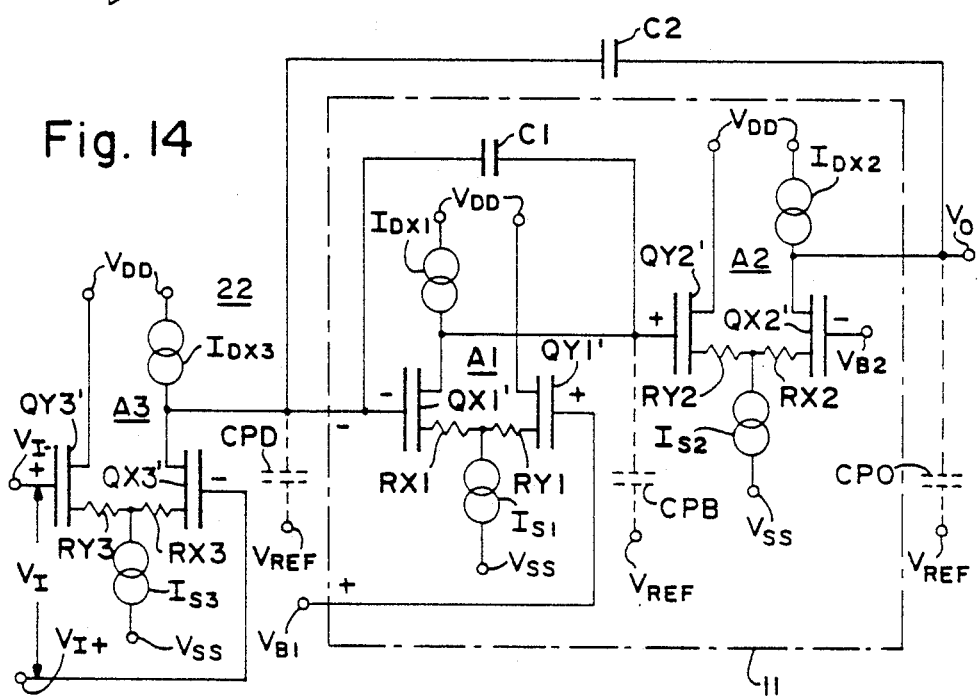
FIG. 14 is an FET embodiment of the amplifier of FIG. 6b.

For example, FIG. 14 depicts an FET embodiment of FIG. 6b analogous to FIG. 7b. Each pair of emitter-coupled bipolar transistors in FIG. 7b is replaced with a corresponding pair of source-coupled insulated-gate FET's in FIG. 14 as indicated by the use of the prime notation in FIG. 14.

Methods for manufacturing the various elements of the present amplifier are well known in the semiconductor art. Each amplifier is preferably fabricated as part of a monolithic integrated circuit using PN-junction isolation to separate active regions in a semiconductor wafer.

While the invention has been described with reference to particular embodiments, this description is solely for the purpose of illustration and is not to be construed as limiting the scope of the invention claimed below. For example, semiconductor elements of opposite polarity to those described above may be employed to accomplish the same results. If the characteristics of the negative feedback network to be used with one of the present amplifiers are known before that amplifier is designed, the values of its compensating capacitors may be suitably adjusted to satisfy the stability rule for loop gain without necessarily meeting the open-loop gain roll-off stability criterion. Thus, various modifications, changes, and applications may be made by those skilled in the art without departing from the true scope and spirit of the invention as defined by the appended claims.

What I claim is:

1. An amplifier for amplifying an input signal received at least partially at an inverting input thereof to produce an inverted output signal at an ouput thereof, the amplifier comprising:
   a composite amplifier section comprising:
     a first stage for amplifying an input signal received at least partially at an inverting input thereof to produce an inverted output signal at an output thereof;
     a second stage for amplifying an input signal received at least partially at a non-inverting input thereof to produce a non-inverted output signal at an output thereof, the output of one of the two stages coupled to the input of the other of the two stages, the composite section having an inverting input and an output respectively coupled to the remaining input and output of the two stages; and
     a first capacitor coupled between the output and inverting input of the first stage, the first capacitor being of such a value as to be sufficient in itself to make the forward gain of the composite section roll off no more than 9dB/octave out to its unity-gain frequency;
   a third stage for amplifying an input signal received at least partially at a non-inverting input thereof to produce a non-inverted output signal at an output thereof, the output of one of the composite section and the third stage coupled to the input of the other of the composite section and the third stage, the remaining input and output of the composite section and the third stage respectively coupled to the input and output of the amplifier; and
   a second capacitor coupled between the output and inverting input of the composite section, the second capacitor being of such a value that the capacitors are sufficient in themselves to make the forward gain of the amplifier roll off no more than 9 dB/octave out to its unity-gain frequency.

2. An amplifier as in claim 1 wherein each of the second and third stages is a transconductance stage.

3. An amplifier as in claim 2 wherein there is no frequency-compensation circuitry internal to any of the stages.

4. An amplifier as in claim 1 wherein:
   the amplification of the input signal to each of the second and third stages to produce its output signal occurs without any intervening signal inversion; and the intercouplings of the stages, the composite section, and the amplifier by way of their inputs and outputs are along signal paths in which there is no signal inversion.

5. An amplifier as in claim 4 wherein the amplification of the input signal to the first stage to produce its output signal occurs with a single intervening signal inversion.

6. An amplifier as in claim 2 wherein the output of the first stage is coupled to the non-inverting input of the second stage whose output is coupled to the non-inverting input of the third stage.

7. An amplifier as in claim 2 wherein the output of the third stage is coupled to the inverting input of the first stage whose output is coupled to the non-inverting input of the second stage.

8. An amplifier as in claim 2 wherein the output of the second stage is coupled to the inverting input of the first stage whose output is coupled to the non-inverting input of the third stage.

9. An amplifier as in claim 2 wherein the output of the third stage is coupled to the non-inverting input of the second stage whose output is coupled to the inverting input of the first stage.

10. An amplifier as in claim 2 wherein the first stage is a transconductance stage.

11. An amplifier as in claim 2 wherein: the amplifier is coupled between a first voltage supply and a second voltage supply; each of the second and third stages has an inverting input; and each of the second and third stages comprises first and second like-polarity transistors each having a first flow electrode, a second flow electrode, and a control electrode for regulating current transmission between the flow electrodes, the first electrodes coupled together and to the first supply, the control electrodes of the first and second transistors respectively coupled to the inverting and non-inverting inputs of that stage, the second electrode of the first transistor coupled to the output of that stage, and the second electrode of the second transistor coupled to the second supply.

12. An amplifier as in claim 11 wherein the first stage comprises: a first transistor having a first flow electrode coupled to the first supply, a second flow electrode coupled to the output of the first stage, and a control electrode which regulates current transmission between the flow electrodes of the first transistor in the first stage and is coupled to its inverting input.

13. An amplifier as in claim 12 wherein the first stage includes: a second transistor having a first flow electrode, a second flow electrode coupled to the second supply, and a control electrode which regulates current transmission between the flow electrodes of the second transistor in the first stage and is coupled to a non-inverting input thereof, the transistors in the first stage being of like polarity and having their first electrodes coupled together.

14. An amplifier as in claim 12 wherein each transistor is a bipolar transistor having a base, an emitter, and a collector which are respectively the control, first, and second electrodes of that transistor.

15. An amplifier as in claim 12 wherein each transistor is a field-effect transistor having a gate, a source, and a drain which are respectively the control, first, and second electrodes of that transistor.

16. An amplifier for amplifying an input signal consisting of a signal received at a main inverting input thereof relative to a signal received at a further non-inverting input thereof to produce an inverted output signal at a main output thereof and a non-inverted output signal at a further output thereof, the amplifier comprising:

a composite amplifier section comprising:

a first stage for amplifying an input signal consisting of a signal received at a main inverting input thereof relative to a signal received at a further non-inverting input thereof to produce an inverted output signal at a main output thereof and a non-inverted output signal at a further output thereof;

a second stage for amplifying an input signal consisting of a signal received at a main non-inverting input thereof relative to a signal received at a further inverting input thereof to produce a non-inverted output signal at a main output thereof and an inverted output signal at a further output thereof, the main and further outputs of one of the two stages respectively coupled to the main and further inputs of the other of the two stages, the composite section having a main inverting input, a further non-inverting input, a main output, and a further output respectively coupled to the remaining main input, further input, main output, and further output of the two stages; and a pair of first capacitors, one coupled between the main input and main output of the first stage, the other coupled between the further input and further output of the first stage;

a third stage for amplifying an input signal consisting of a signal received at a main non-inverting input thereof relative to a signal received at a further inverting input thereof to produce a non-inverted output signal at a main output thereof and an inverted output signal at a further output thereof, the main and further outputs of one of the composite section and the third stage respectively coupled to the main and further inputs of the other of the composite section and the third stage, the remaining main and further inputs and main and further outputs of the composite section and the third stage respectively coupled to the main and further inputs and main and further outputs of the amplifier; and a pair of second capacitors, one coupled between the main output and main input of the composite section, the other coupled between the further output and further input of the composite section.

17. An amplifier as in claim 16 wherein;

the first capacitors are of such values as to be sufficient in themselves to make the forward gain of the composite section roll off no more than 9dB/octave out to its unity-gain frequency; and the second capacitors are of such values that the capacitors are sufficient in themselves to make the forward gain of the amplifier roll off no more than 9dB/octave out to its unity-gain frequency.

18. An amplifier for amplifying an input signal received at least partially at an inverting input thereof to produce an inverted output signal at an output thereof, the amplifier comprising:

a composite amplifier section comprising:

a first stage for amplifying a pair of input signals received at least partially at a pair of respective inverting inputs thereof to produce a pair of inverted output signals at a pair of respective outputs thereof coupled to an output of the composite section;

a second stage for amplifying an input signal received at least partially at a non-inverting input thereof coupled to an inverting input of the composite section to produce a pair of non-inverted output signals at a pair of respective outputs thereof respectively coupled to the inputs of the first stage; and a pair of first capacitors respectively corresponding to the inputs of the first stage, each first capacitor coupled between the corresponding inverting input of the first stage and its output;

a third stage for amplifying an input signal received at least partially at a non-inverting input thereof to produce a non-inverted output signal at an output thereof, the output of one of the composite section and the third stage coupled to the input of the other of the composite section and the third stage, the remaining input and output of the composite section and the third stage respectively coupled to the input and output of the amplifier; and a second capacitor coupled between the output and inverting input of the composite section.

19. An amplifier as in claim 18 wherein:
the first capacitors are of such values as to be sufficient in themselves to make the forward gain of the composite section roll off no more than 9dB/octave out to its unity-gain frequency; and
the second capacitor is of such a value that the capacitors are sufficient in themselves to make the forward gain of the amplifier roll off no more than 9dB/octave out to its unity-gain frequency.

20. An amplifier as in claim 18 wherein:
the third stage is the leading one of the composite section and third stage, whereby the output of the third stage is coupled to the inverting input of the composite section;
the amplifier has a non-inverting input coupled to an inverting input of the third stage which also amplifies its input signal to produce an inverted output signal at a further output thereof;
the composite section has a non-inverting input coupled to the further output of the third stage and to an inverting input of the second stage; and
an additional second capacitor is coupled between the non-inverting input of the composite section and a reference voltage source.

21. An amplifier as in claim 20 wherein:
the first capacitors are of such values as to be sufficient in themselves to make the forward gain of the composite section roll off no more than 9dB/octave out to its unity-gain frequency; and
the second capacitors are of such values that the capacitors are sufficient in themselves to make the forward gain of the amplifier roll off no more than 9dB/octave out to its unity-gain frequency.

22. An amplifier as in claim 21 wherein the first stage comprises a pair of complementary transistors, each having a first flow electrode, a second flow electrode, and a control electrode for regulating current transmission between the flow electrodes, the control electrodes respectively coupled to the inputs of the first stage whose outputs are respectively coupled to the second electrodes.

23. An amplifier as in claim 22 wherein each transistor is a bipolar transistor having a base, an emitter, and a collector which are respectively the control, first, and second electrodes of that transistor.

24. An amplifier as in claim 17, 19, or 21 wherein each stage is a transconductance stage.

25. An amplifier as in claim 24 wherein there is no frequency-compensation circuitry internal to any of the stages.

* * * * *